United States Patent
Kuhwald et al.

(10) Patent No.: US 8,952,681 B2
(45) Date of Patent: Feb. 10, 2015

(54) MEASURING MACHINE AND MEASURING METHOD FOR MEASURING DIFFERENTIAL SIGNALS

(75) Inventors: Thomas Kuhwald, Markt Schwaben (DE); Johann Huber, Markt Schwaben (DE); Michael Reinhold, Munich (DE); Wolfgang Herbordt, Munich (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 645 days.

(21) Appl. No.: 13/266,705

(22) PCT Filed: Jan. 25, 2010

(86) PCT No.: PCT/EP2010/000415
§ 371 (c)(1),
(2), (4) Date: Jan. 17, 2012

(87) PCT Pub. No.: WO2010/124752
PCT Pub. Date: Nov. 4, 2010

(65) Prior Publication Data
US 2012/0119726 A1    May 17, 2012

(30) Foreign Application Priority Data
Apr. 27, 2009 (DE) .......... 10 2009 019 039

(51) Int. Cl.
*G01R 1/06* (2006.01)
*G01R 15/00* (2006.01)
*G06F 15/00* (2006.01)
*G01R 13/02* (2006.01)
*G01R 1/067* (2006.01)

(52) U.S. Cl.
CPC ........ G01R 13/0254 (2013.01); G01R 1/06766 (2013.01)
USPC .............................. 324/149; 702/57; 702/189

(58) Field of Classification Search
USPC ......................................................... 324/149
See application file for complete search history.

(56) References Cited

U.S. PATENT DOCUMENTS

| 4,812,746 | A | 3/1989 | Dallas, Jr. |
| 6,973,407 | B1 | 12/2005 | Abraham |
| 2003/0195713 | A1 | 10/2003 | McTigue |
| 2006/0009941 | A1* | 1/2006 | Motz et al. .................... 702/116 |

FOREIGN PATENT DOCUMENTS

| DE | 2003/0195713 A1 | 2/2007 |
| WO | WO 2007/071608 A1 | 6/2007 |

* cited by examiner

*Primary Examiner* — Bot Ledynh
(74) *Attorney, Agent, or Firm* — Ditthavong & Steiner, P.C.

(57) ABSTRACT

A measuring device for the measurement of differential signals including a real-time portion, which contains two probes, a signal adder and a triggering device. The probes each record a partial signal of a differential signal. The signal adder adds the partial signals to form a differential signal. The triggering device implements a triggering on the basis of the differential signal.

18 Claims, 3 Drawing Sheets

MEASURING MACHINE AND MEASURING METHOD FOR MEASURING DIFFERENTIAL SIGNALS

CROSS-REFERENCE TO RELATED APPLICATION

The present application is a national phase application of PCT Application No. PCT/EP2010/000415, filed on Jan. 25, 2010, and claims priority to German Application No. DE 10 2009 019 039.2, filed on Apr. 27, 2009, the entire contents of which are herein incorporated by reference.

BACKGROUND OF THE INVENTION

1. Field of the Invention

The invention relates to a measuring device and a measuring method for the measurement of differential signals, especially for the measurement of a differential signal without the use of a differential probe.

2. Discussion of the Background

With conventional oscilloscopes, differential signals cannot be measured without limitations. With the use of conventional probes with one probe tip on each of two different channels of the oscilloscope, a triggering can be implemented only for one of the two received signals. In the case of non-ideal differential signals, for example, a strongly noise-laden partial signal, a triggering is not always successful. However, especially with differential signals which are laden with a strong, largely identical noise signal, a triggering on only one partial signal is often not possible.

To improve the measurement of differential signals, the use of differential probes is known. In this context, a probe provides two probe tips for the two partial signals of the differential signal. The differential probe is connected to a single channel of an oscilloscope. The entire differential signal is measured via this one channel of the oscilloscope. In this case, triggering is not problematic.

Accordingly, U.S. Pat. No. 6,973,407 B1 discloses a measurement application of a differential probe. Differential probes are, however, very costly to purchase. For this reason, they are not always available or purchasing is not always cost-effective.

SUMMARY OF THE INVENTION

Embodiments of the invention provide a measuring device and a measuring method, which allow a reliable measurement of differential signals without the use of a costly differential probe.

The measuring device according to the invention for the measurement of differential signals provides a real-time portion, which contains two probes, a signal adder or respectively a signal subtracter and a triggering device. The probes each record a partial signal of a differential signal. The signal adder or respectively signal subtracter adds or subtracts the partial signals to or from a differential signal. The triggering device implements a triggering on the basis of the differential signal. Accordingly, a secure triggering is guaranteed.

The real-time portion preferably contains two analog/digital converters. The analog/digital converters preferably digitize the recorded partial signals. The signal adder or respectively signal subtracter preferably adds or subtracts the digital partial signals in a digital manner. Accordingly, a precise addition is guaranteed.

The measuring device preferably contains a processing device. The processing device processes and/or advantageously buffers the differential signal and/or at least one partial signal of the differential signal. Accordingly, a precise analysis of the differential signal is possible.

The signal adder or respectively signal subtracter and/or the triggering device are advantageously realised by means of an FPGA (field programmable gate array) or an ASIC (application specific gated array). Accordingly, the measuring device according to the invention can be developed and manufactured at low cost.

The probes preferably each contain precisely one signal connection and one earth connection. Accordingly, favorable, readily available probes can be used.

The measuring device preferably provides a display device. The display device advantageously displays results of measurements implemented. Accordingly, the results of the measurements can be displayed without further devices, such as an external monitor.

The real-time portion preferably processes incoming signals with a sampling rate of the analog/digital converters without buffering them. Accordingly, a reliable triggering is achieved.

BRIEF DESCRIPTION OF THE DRAWINGS

The invention is described by way of example below on the basis of the drawings, in which an advantageous exemplary embodiment of the invention is presented. The drawings are as follows.

DETAILED DESCRIPTION OF EXEMPLARY EMBODIMENTS OF THE INVENTION

Figure 2:
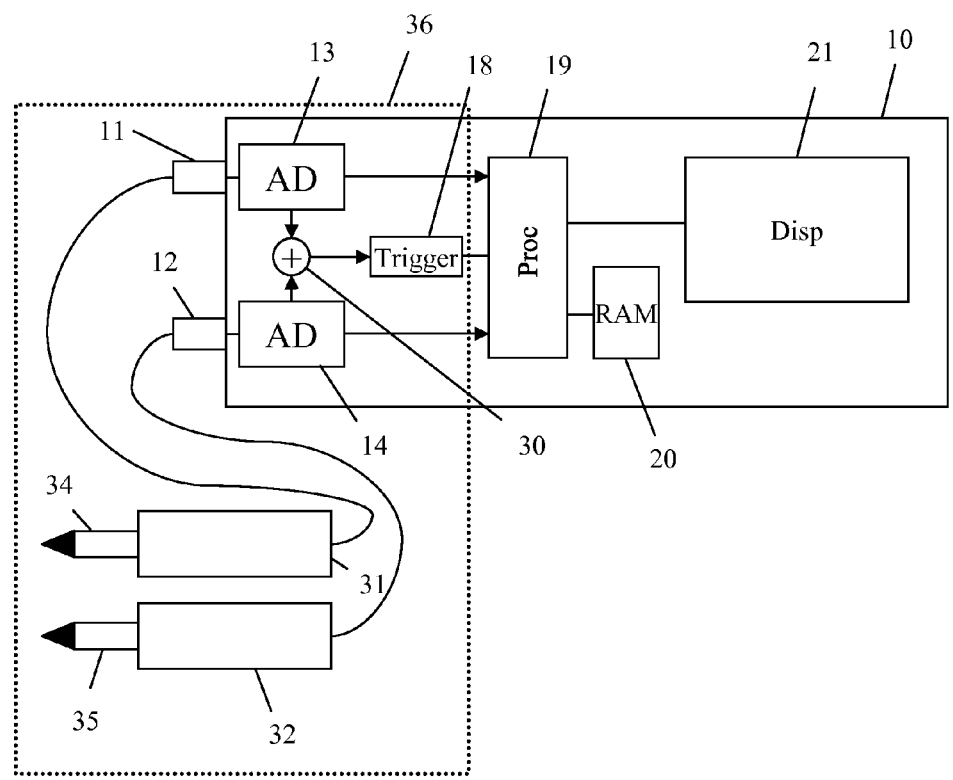
FIG. 2 shows an exemplary embodiment of the measuring device according to the invention.
Figure 3:
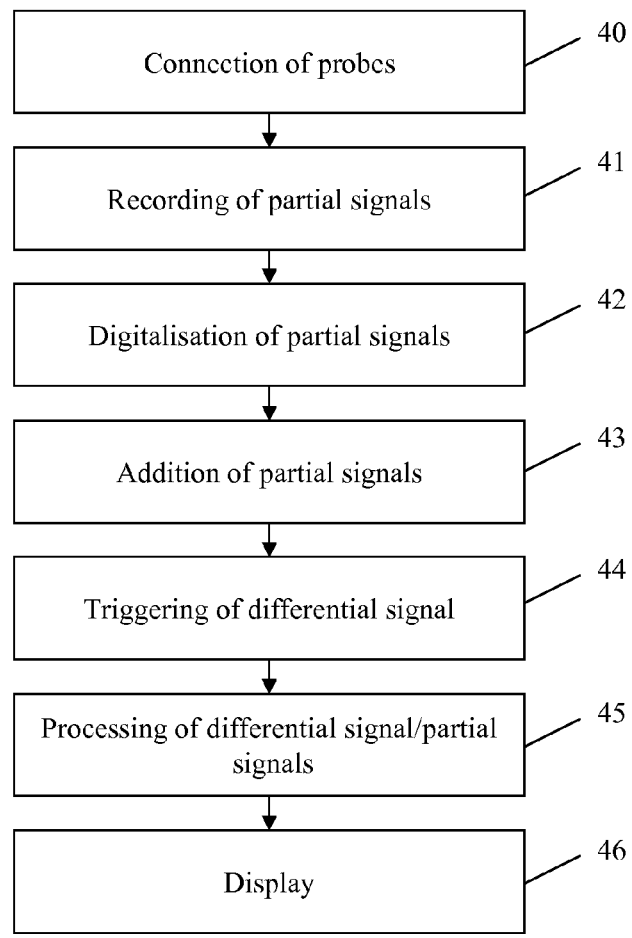
FIG. 3 shows an exemplary embodiment of the measuring method according to the invention.

Initially, with reference to FIG. 1, the problems upon which the measuring device according to the invention and the measuring method according to the invention are based are explained with reference to an exemplary measuring device. With reference to FIG. 2, the structure and method of functioning of an exemplary embodiment of the measuring device according to the invention are described. With reference to FIG. 3, the method of functioning of an exemplary embodiment of the measuring method according to the invention is shown. In some cases, the description of identical elements in similar drawings has not been repeated.

Figure 1:
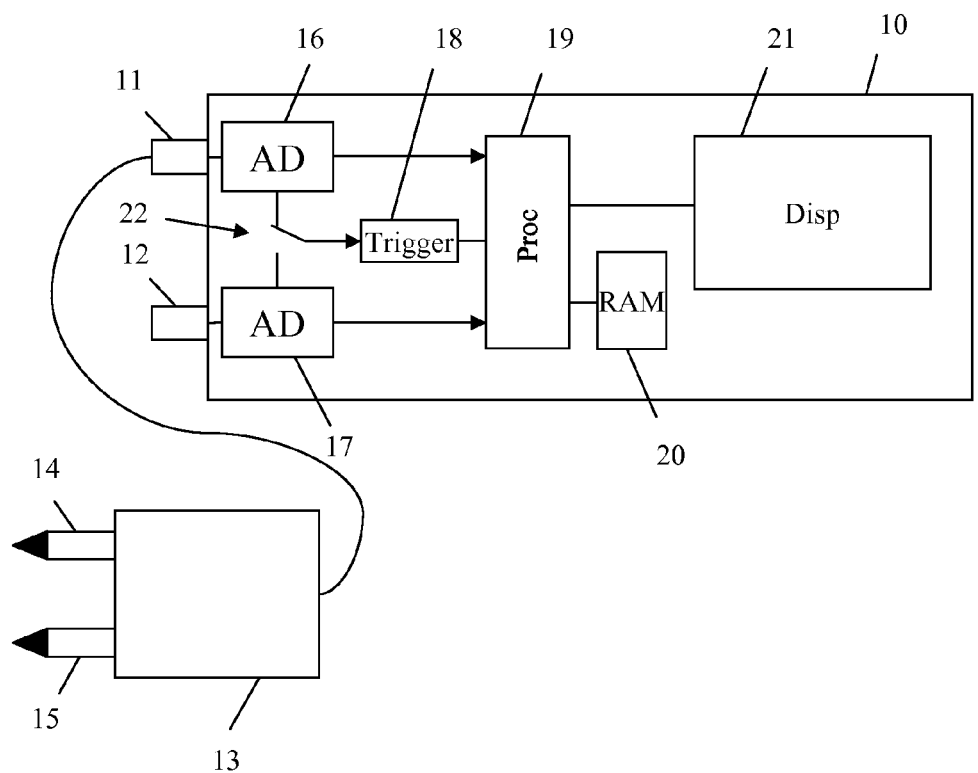
FIG. 1 shows an exemplary measuring device.

FIG. 1 shows an exemplary measuring device. A differential probe 13 with the two probe tips 14, 15 is connected via a first connection 11 to a housing 10. The measuring device provides a second connection 12. Furthermore, the measuring device provides two analog/digital converters 16, 17. The first analog/digital converter 16 is allocated to the first connection 11 and connected to the latter. The second analog/digital converter 17 is connected to the second connection 12. A triggering device 18 is optionally connected to the first analog/digital converter 16 or to the second analog/digital converter 17. The analog/digital converters 16, 17 and the triggering device 18 are connected to a processing device 19. The processing device 19 is further connected to a buffer 20 and a display device 21.

The probe tips 14, 15 of the differential probe 13 are supplied with a differential signal. The differential probe 13 transmits the analog differential signal to the connection 11. From there, it reaches the first analog/digital converter 16. This digitizes the signal and relays it with the illustrated switch position to the triggering device 18 and to the processing device 19. The triggering device 18 implements a triggering of the digitized signal. The triggering device 18 here is controlled by the processing device 19. The processing device 19 processes the triggered, digitized differential signal further and buffers it in the buffer 20. Moreover, it displays the signal on the display device 21.

The disadvantage with this exemplary measuring device is that a differential probe is costly to manufacture. Furthermore, it is disadvantageous that the two partial signals from which the differential signal is composed cannot be processed separately from one another. For example, if interference occurs in one of the two partial signals, this cannot be localised. For example, if a strong noise is present in one of the two partial signals, a reliable triggering by the triggering device is not possible, and a further processing of the entire differential signal becomes impossible.

FIG. 2 shows an exemplary embodiment of the measuring device according to the invention. Two conventional probes 31, 32 each provide a probe tip 34, 35. The first probe 31 is connected to a first connection 11. The second probe 32 is connected to a second connection 12. The connections 11, 12 are arranged in a housing 10. The first connection 11 is connected to an analog/digital converter 13. The second connection 12 is connected to a second analog/digital converter 14. The two analog/digital converters 13, 14 are connected to a signal adder 30. Furthermore, they are connected to a processing device 19. The signal adder 30 is further connected to a triggering device 18. The triggering device 18 is similarly connected to the processing device 19. The analog/digital converters 13, 14, the signal adder 30, the triggering device 18 and the probes 31, 32 together form a real-time portion 36 of the measuring device. That is, these components operate without intermediate buffering and process the incoming signals with the velocity of the signal input. Moreover, the processing device 19 is connected to a buffer 20 and a display device 21.

A differential signal is recorded by the two probes 21, 32. In this context, a first partial signal of the differential signal is recorded by means of the probe tip 34 of the first probe 31. A second partial signal of the differential signal is recorded by means of the probe tip 35 of the second probe 32. The partial signals of the differential signals are supplied via the connections 11, 12 to the analog/digital converters 13, 14. The analog/digital converters 13, 14 convert the analog partial signals of the differential signal into digital partial signals of the differential signal. The digital partial signals are supplied to the signal adder 30. The signal adder 30 adds the signals to a common differential signal and relays it to the triggering device 18. The triggering device 18 implements a triggering of the common differential signal. In this context, the triggering is controlled by the processing device 19. The analog/digital converters 13, 14 supply the digital partial signals of the differential signal further to the processing device 19. The processing device 19 processes the partial signals of the differential signal further. Optionally, the processing device 19 forms a differential signal from the partial signals of the differential signal by addition. The processing device 19 buffers the partial signals, or the differential signal in the buffer 20 and displays results of the measurements on the display device 21.

Optionally, the signal adder 30, the triggering device 18 and the processing device 19 are formed on an FPGA (field programmable gate array) or an ASIC (application specific dated array).

By contrast with the exemplary measuring device presented in FIG. 1, in the case of the measuring device according to the invention, a reliable processing and measurement of the differential signal is possible even with disturbed partial signals of the differential signal. Furthermore, a costly and frequently unavailable differential probe is not required.

FIG. 3 shows a first exemplary embodiment of the measuring method according to the invention. In a first step 40, two probes are each supplied with a partial signal of a differential signal. This is normally implemented by connecting the probes to a device under test. In a second step 41, the two partial signals of the differential signal are recorded by means of the two probes. In a third step 43, the recorded partial signals of the differential signal are digitized. The digitization is implemented here with a given sampling rate. In a fourth step 43, the digitized partial signals are added. In this context, the addition is implemented in real-time. That is, for each sampled value of the digitized partial signals of the differential signal, an added sampled value is generated. Accordingly, the addition is implemented in such a manner that the resulting signal is a digital differential signal. If necessary, one of the partial signals of the differential signal is inverted or a signal subtracter is used instead of a signal adder, in order to subtract one of the two partial signals from other partial signals.

In a fifth step 44, a triggering of the digital differential signal obtained is accordingly implemented. In a sixth step 45, the digitized partial signals of the differential signal and the differential signal obtained through addition are further processed. In a seventh step 46, results of the measurement, that is, results of the further processing from the sixth step are displayed.

The invention is not restricted to the illustrated exemplary embodiment. As already mentioned, different measuring devices can be used. An expansion to more than two channels, that is, to several differential signals is also conceivable. All of the features described above or illustrated in the drawings can be combined with one another as required within the scope of the invention.

The invention claimed is:

1. A measuring device for measuring differential signals comprising a real-time portion,
    wherein the real-time portion contains two probes, a signal adder and/or a signal subtracter and a triggering device,
    wherein the two probes each record a partial signal of a differential signal,
    wherein the signal adder or respectively the signal subtracter adds or subtracts the partial signal of the differential signal,
    wherein the triggering device implements a triggering on a basis of the differential signal,
    wherein the real-time portion operates without intermediate buffering,
    wherein the real-time portion contains two analog/digital converters,
    wherein the analog/digital converters digitize the recorded partial signals, and
    wherein the signal adder or respectively the signal subtracter adds or subtracts the digitized recorded partial signals.

2. The measuring device according to claim 1,
    wherein the measuring device contains a processing device, and
    wherein the processing device processes the differential signal and/or at least one partial signal of the differential signal and/or buffers the processed signal in a buffer.

3. The measuring device according to claim 1,
    wherein the signal adder or respectively signal subtracter and/or the triggering device are realized by means of an FPGA (field programmable gate array) or an ASIC (application specific gated array).

4. The measuring device according to claim 1,
wherein the two probes each contain one signal connection and one earth connection.

5. The measuring device according to claim 1,
wherein the measuring device provides a display device, which displays results of implemented measurements.

6. The measuring device according to claim 1,
wherein the real-time portion processes incoming signals with a sampling rate of the analog/digital converters, and
wherein the real-time portion does not buffer the signals.

7. A measuring method for the measurement of differential signals, said method comprising:
recording a partial signal of a differential signal using two probes;
adding the two partial signals to or subtracting the two partial signals from the differential signal; and
implementing a triggering on the basis of the differential signal,
wherein the addition or subtraction and triggering are implemented at a velocity of recording the two partial signals without intermediate buffering,
wherein after recording, the two partial signals are converted into digital partial signals, and
wherein the digital partial signals are added or subtracted in a digital manner.

8. The measuring method according to claim 7,
wherein the differential signal and/or at least one partial signal of the differential signal are further processed and/or buffered.

9. The measuring method according to claim 7,
wherein the addition or respectively subtraction and/or the triggering are implemented by an FPGA (field programmable gate array) or an ASIC (application specific gated array).

10. The measuring method according to claim 7,
wherein the two probes each record one signal.

11. The measuring method according to claim 7,
wherein results of implemented measurements are displayed by a display device.

12. The measuring device according to claim 1,
wherein the measuring device contains a processing device, and
wherein the processing device processes the differential signal and/or at least one partial signal of the differential signal and/or buffers the processed signal in a buffer.

13. The measuring device according to claim 1,
wherein the signal adder or respectively signal subtracter and/or the triggering device are realized by means of an FPGA (field programmable gate array) or an ASIC (application specific gated array).

14. The measuring device according to claim 1,
wherein the two probes each contain one signal connection and one earth connection.

15. The measuring device according to claim 1,
wherein the measuring device provides a display device, which displays results of implemented measurements.

16. The measuring method according to claim 7,
wherein the differential signal and/or at least one partial signal of the differential signal are further processed and/or buffered.

17. The measuring method according to claim 8,
wherein the addition or respectively subtraction and/or the triggering are implemented by an FPGA (field programmable gate array) or an ASIC (application specific gated array).

18. The measuring method according to claim 7,
wherein the two probes each record one signal.

\* \* \* \* \*